United States Patent [19]

Zoutendyk et al.

[11] Patent Number: 4,675,601
[45] Date of Patent: Jun. 23, 1987

[54] METHOD OF MEASURING FIELD FUNNELING AND RANGE STRAGGLING IN SEMICONDUCTOR CHARGE-COLLECTING JUNCTIONS

[75] Inventors: John A. Zoutendyk, La Crescenta; Carl J. Malone, Los Angeles, both of Calif.

[73] Assignee: The United States of America as represented by the Administrator of the National Aeronautics and Space Administration, Washington, D.C.

[21] Appl. No.: 802,769

[22] Filed: Nov. 27, 1985

[51] Int. Cl.$^4$ .................................... G01R 31/26
[52] U.S. Cl. ........................... 324/158 R; 324/158 D
[58] Field of Search ........... 324/158 R, 158 D, 158 T; 357/29

[56] References Cited

U.S. PATENT DOCUMENTS

| | | | |
|---|---|---|---|
| 3,659,200 | 4/1972 | Ota | 324/158 D |
| 3,731,192 | 5/1973 | Miller | 324/158 D |
| 3,748,579 | 7/1973 | Henry et al. | 324/158 D |
| 3,808,476 | 4/1974 | McCann, Jr. | 317/235 R |
| 3,943,442 | 3/1976 | Fletcher et al. | 324/158 T |
| 4,366,493 | 12/1982 | Braslau et al. | 357/4 |
| 4,400,710 | 8/1983 | Nishizawa et al. | 357/15 |
| 4,424,525 | 1/1984 | Mimura | 357/23 |
| 4,449,140 | 5/1984 | Board | 357/7 |
| 4,564,808 | 1/1986 | Faughnan et al. | 324/158 D |

FOREIGN PATENT DOCUMENTS 0741350 6/1980 U.S.S.R. .................. 324/158 D

OTHER PUBLICATIONS

"A Field-Funneling Effect on the Collection of Alpha-Particle-Generated Carriers in Silicon Devices, by Hsieh et al., IEEE EDL-2, #4, 4/81, pp. 103–105.
"Profiling of Optically Active Defects", by Greve et al., IEEE Trans. on Electron Dev., ED-27, #11, 11/80, pp. 2152–2155.
"Determination of Wafer Channel Length of a Mosfet", by Beilstein et al., IBM Tech. Disc. Bull., 8/77, vol. 20, #3, pp. 1085–1086.
C. Hsieh, P. C. Murley, R. r. O'Brien, "Collection of Charge from Alpha-Particle Tracks in Silicon Devices,38 IEEE Transactions on Electron Devices, vol. ED-30, No. 6, pp. 686–693, Jun. 1983.

Primary Examiner—Reinhard J. Eisenzopf
Assistant Examiner—W. Burns
Attorney, Agent, or Firm—Paul F. McCaul; John R. Manning; Thomas H. Jones

[57] ABSTRACT

Electric-field funneling length is measured while irradiating a semiconductor charge-collecting junction with electron-hole-pair generating charged particles at a first junction bias voltage. The bias voltage is then reduced to a second level in order to reduce the depth of the depletion region such that the total charge can no longer be collected by drift and measured in the energy band previously displayed in the multichannel analyzer. This is representative of the maximum electric field funnelling length which may be calculated by measuring the difference at the second bias voltage level of the depletion width and the ion penetration range. The bias voltage is further lowered to a third level at which the particles are collected over a spread of energy levels while at least some of the particles are still collected at the selected energy level. From this the different depths of penetration of the particles are determined while additional effects due to diffusion are minimized.

6 Claims, 8 Drawing Figures

| RUN | PHOTO | BIAS(V) | $W_{SB}(\mu m)^{(2)}$ | $R^{(3)}-W_{SB}(\mu m)$ | $\delta E_{MAX}$(MeV) | $\Delta E$(MeV) | $Q_C(pC)^{(4)}$ |
|---|---|---|---|---|---|---|---|
| 1 | A | 58 | 61 | <0 | <0.01 | <0.1 | 0.390 |
| 2 | — | 48 | 55 | 4 | <0.01 | <0.1 | 0.390 |
| 3 | — | 39 | 50 | 9 | <0.01 | <0.1 | 0.390 |
| 4 | B | 30 | 44 | 15 | 0.03 | <0.1 | 0.389 |
| 5 | C | 20 | 36 | 23 | 0.21 | 0.4 | 0.381 |
| 6 | D | 11 | 27 | 32 | 1.01 | 0.4 | 0.345 |

(1) Au/N-TYPE Si; $N_S = 2 \times 10^{13}$ cm$^{-3}$ FROM CAPACITANCE MEASUREMENTS
(2) $W_{SB} = 7.99 (V + 0.5)^{1/2}$ $\mu m$
(3) FOR 8.78 MeV $\alpha$-PARTICLE IN Si, R = 59 $\mu m$
(4) $Q_C(pC) = E(MeV)/22.5$ MeV/pC

FIG. 7 ion tracks as a function of reverse bias voltage. The method of the present invention may be understood with the aid of FIG. 1 of the drawings which is a schematic cross section for a partially depleted heavy ion SSBD showing electron-hole plasma generated along an ion track.

METHOD OF MEASURING FIELD FUNNELING AND RANGE STRAGGLING IN SEMICONDUCTOR CHARGE-COLLECTING JUNCTIONS

ORIGIN OF INVENTION

The invention described herein was made in the performance of work under a NASA contract and is subject to the provisions of Public Law 96-517 (35 USC 202) in which the contractor has elected to retain title.

BACKGROUND OF THE INVENTION

This invention relates to a method measuring electric-field funneling length created by irradiating a semiconductor charge-collecting junction with an electron-hole-pair generating charged particle, and more particularly to where the charged particle penetrates beyond the depletion region in the semiconductor layer and yet all the charge generated at the selected energy level is collected by drift rather than diffusion.

One form of semiconductor charge-collecting junction, a silicon surface (Schottky) barrier detector, is used extensively for both counting and energy measurement of charged particles. For heavy ions with limited range in silicon, a partially depleted detector can knowingly be used to accurately measure the ion kinetic energy, provided that the ion range does not exceed the width of the depletion layer. However, it is not generally known that the range of the ion may actually exceed the depletion width and still have all of the charge generated by the ion collected at the Schottky barrier. This is due to an extension of the electric field outside the depletion region along the end of the ion track, an occurrence which has been labeled "field funneling," and is recognized in an article by C. M. Hsieh, P. C. Murley, and R. R. O'Brien, "Collection of Charge from Alpha-Particle Tracks in Silicon Devices," IEEE Transactions on Electron Devices, Vol. ED-30, No 6, pp. 686–693, June 1983.

In that article, the authors disclose collection time measurement apparatus in which a device under test is biased and irradiated with an alphaparticle source. The charge collected is then transmitted through an FET probe to a wide band amplifier and displayed on a high frequency oscilloscope. The collection time was measured through the FET probe. When an alpha-particle struck the collecting structure, the voltage began to drop rapidly as electrons were collected. The waveform was a negative voltage amplitude proportional to the collected charge. This waveform was amplified in a wide band amplifier and displayed on a high frequency real time oscilloscope. The pulse-heights were analyzed in a multichannel analyzer in a manner different from that employed in the present invention.

OBKECTS AND SUMMARY OF THE INVENTION

It is an object of this invention to provide a method of measuring electric-field funneling length in a semiconductor charge-collecting junction at a junction bias voltage level at which the field funneling length is at a maximum.

An object of another aspect of the invention is to measure range straggling at a bias voltage level at which effects due to diffusion are minimized.

In accordance with the invention electricfield funneling length is measured while irradiating a semiconductor charge-collecting junction with electron-hole-pair generating charged particles at a first junction bias voltage level which is selected such that the ion penetration range is shorter than the depletion region so that all the charge generated at a selected energy level is collected by drift. The collected charge is measured in an energy band of a multichannel analyzer. The bias voltage is then reduced to a second level in order to reduce the depth of the depletion region such that the total charge can no longer be collected by drift and measured in the energy band previously displayed in the multichannel analyzer. This is done to obtain the point at which the charge is no longer fully collected which is representative of the maximum electric field funneling length which may be calculated by measuring the difference at the second bias voltage level of the depletion width and the ion penetration range.

In accordance with another aspect of the invention the bias voltage is further lowered to a third level at which the particles are collected over a spread of energy levels in the multichannel analyzer, while at least some of the particles are still collected at the selected energy level. From this the different depths of penetration of the particles are determined while additional effects due to diffusion are minimized.

The novel features that are considered characteristic of the invention are set forth with particularity in the appended claims. The invention will best be understood from the following description when read in connection with the accompanying drawings.

BRIEF DESCRIPTION OF THE DRAWINGS

FIG. 7 is a table of silicon-surface-barrier detector charge-collection data in which runs 1, 4, 5, and 6 illustrating the data in FIGS. 6a, b, c, and d.

DETAILED DESCRIPTION OF THE INVENTION

The method of this invention measures electric field funneling length when irradiating a semiconductor charge-collecting junction generally with electron-hole-pair generating charged particles. A preferred embodiment involves the use of a silicon surface barrier detector for the semiconductor charge-collecting junction. One can observe the field funneling effect experimentally in silicon surface barrier detectors (hereafter SSBDs) simply by measuring the charge collected from an ion of certain energy and range as a function of detector bias potential. Differential capacitance measurements yield the depletion width as a function of bias voltage. By knowing the range of a monoenergetic ion, it can be observed that the plasma charge generated along an ion track is fully collected even when the depletion width is less than the ion range. However, as the depletion width is diminished by lowering the detector bias beyond a certain point, the narrow collected charge energy peak observed for a monoenergetic ion begins both to decrease in amplitude and to be dispersed in energy. This observation is indicative of the fact that the end-of-range charge is now being collected by diffusion rather than by an electric field (of drift). Since diffusion is isotropic some of the charge is therefore lost and a decrease in energy amplitude occurs, and the amount of charge collected from individual ions is dispersed by range straggling of the particles, i.e., energy dispersion occurs. The latter manifestation is not observed if only individual ions are analyzed, i.e., if only individual waveforms from single ions are examined. Data have been obtained from ionized-charge collection in a partially depleted SSBD as a function of bias voltage. The purpose of these measurements is to observe the extent to which the electric field is extended outside the depletion region along an ion track, i.e., the electric funnel length, and to observe the dispersion of a charge collection or energy deposit due to range straggling of ion tracks in SSBDs.

Figure 1:
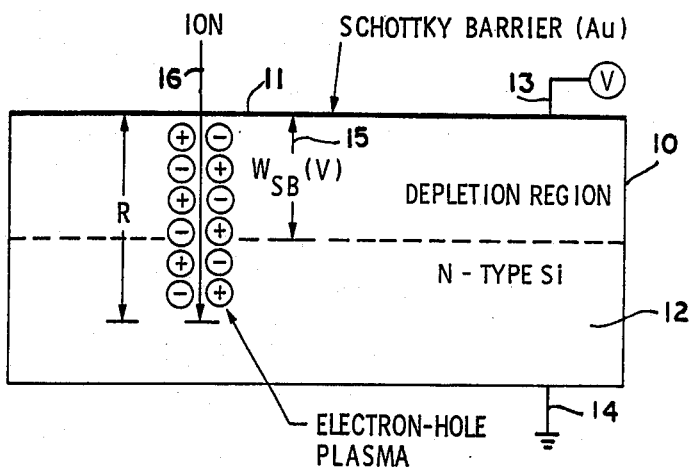
FIG. 1 is a schematic cross section for a partially depleted heavy ion silicon-surface-barrier detector showing electron-hole plasma generated along an ion track.

FIG. 1 illustrates the salient features of an SSBD 10 formed with a gold layer 11 on N-type silicon 12, with a reverse or negative bias of magnitude V applied to the device 10 from terminal 13 to ground 14. A voltage-dependent depletion region of width $W_{SB}$ 15 is created adjacent to the gold layer 11. An ion is illustrated penetrating the SSBD 10 with a range R along the line 16 creating an electron-hole plasma along the ion track as shown.

Figure 3:
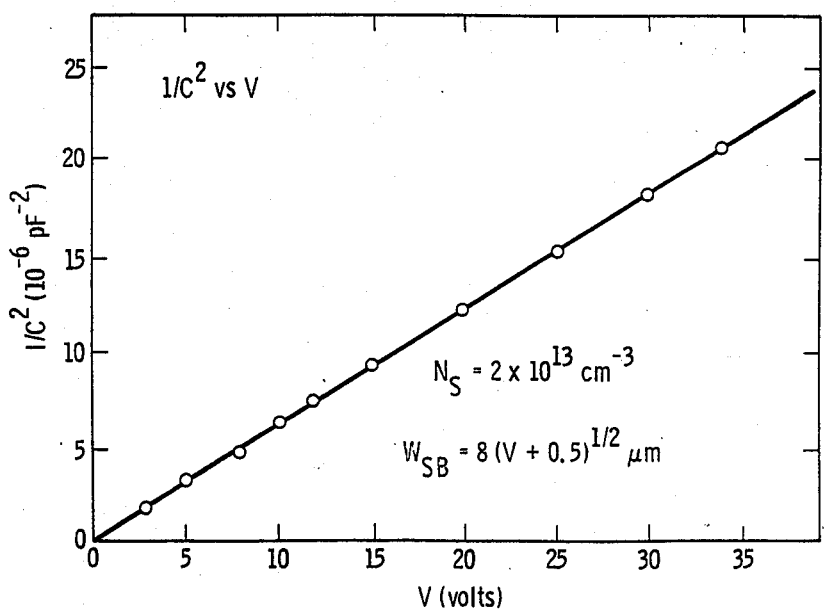
FIG. 3 is a plot of capacitance of a silicon-surface-barrier detector as a function of reverse bias voltage.
Figure 2D:
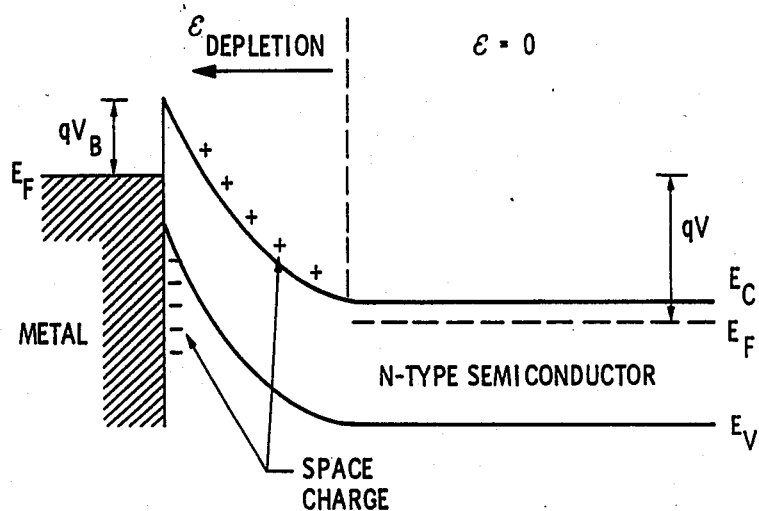
FIG. 2a is a one dimensional energy band diagram for a Schottky barrier in a silicon-surface-barrier detector with reverse bias and no ion track.
FIG. 2b illustrates an energy band diagram with an ion track of range R.
Figure 2B:
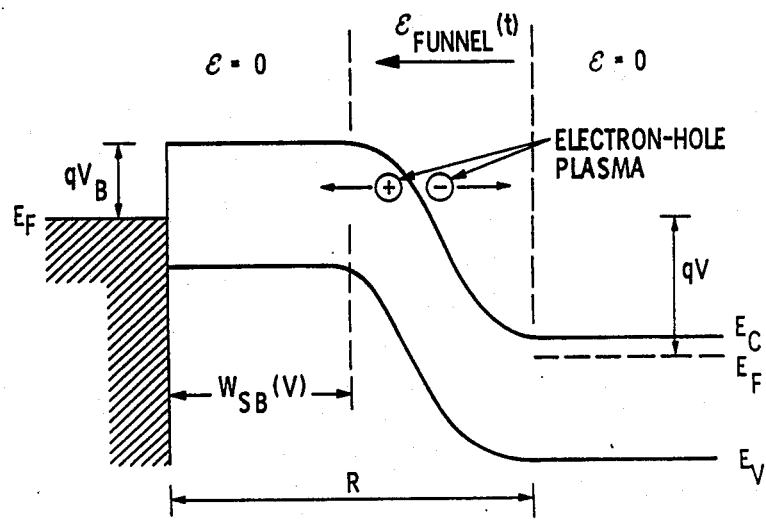

FIGS. 2a and 2b show a one-dimensional energyband diagram for the Schottky barrier. FIG. 2a represents the case for no ion track. The electric field created by the stationary ionized crystal lattice (space charge) is confined to the depletion region. When an ion penetrates the device the electric field is reconfigured as shown in FIG. 2b. Note that the mobile electron-hole pairs or plasma created by the ion track cancel out the electric field originally contained in the depleted region illustrated in FIG. 2a. An electric field is set up at the end of the ion track such that the total potential drop remains constant ($V_B+V$). This electric field $\xi_{FUNNEL}(t)$ defines the spatial extent of the funnel and is highly time dependent. As time progresses after the penetration by the ion, the field retreats back to the original configuration of FIG. 2a. Charge is therefore collected by the total field which extends to the end of the track outside the depletion region. The dependence of the Schottky barrier depletion width on bias potential $W_{SB}(V)$ plus the substrate doping $N_S$ may be obtained from capacitance measurements by plotting $1/C^2$ vs. V, where C is the differential capacitance of the SSBD. The results of capacitance measurements obtained from the SSBD used for the analysis of this embodiment are shown in FIG. 3 where $N_S$ is the N-type substrate donor concentration.

Figure 4:
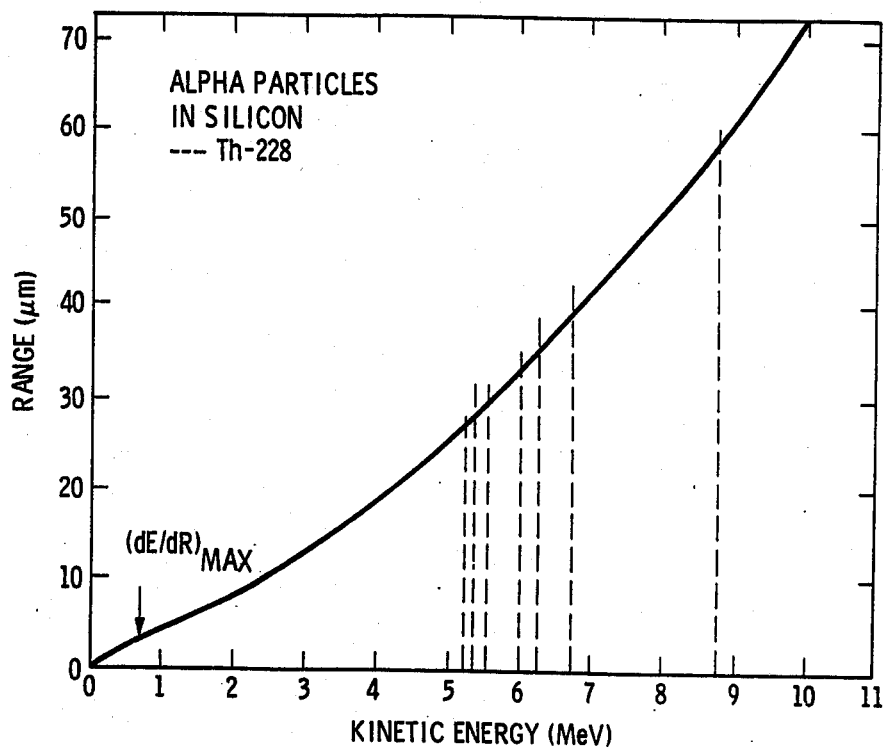
FIG. 4 is a range versus energy curve for alpha particles in silicon showing energies for Th-228 emission.

In order to study the effects of field funneling and range straggling in a SSBD, a Th-228 radiation source was selected which emits alpha-particles with well-defined energies in the range of 5 MeV to 9 MeV and which exhibits reasonably long ranges in silicon (25 $\mu$m to 60 $\mu$m). These ranges are illustrated in FIG. 4. By choosing these relatively low mass ions, the effects of plasma-time delay and pulse-height defect are minimized.

Figure 5:
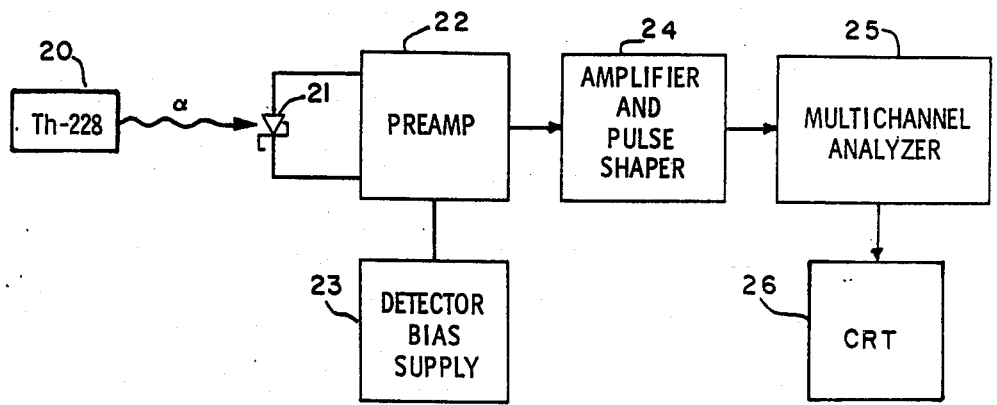
FIG. 5 is a block diagram of the electronic system used for measurement of charge collection from alpha-particle tracts in a silicon surface barrier detector.

Data had been obtained using the electronic system shown schematically in FIG. 5. The charge collected from individual ions of the Th-228 alpha-particle emission source 20 which irradiates the SSBD 21, is amplified in a pre-amplifier 22, biased by a detector-bias supply 23, and amplified further with pulse shaping in an amplifier and pulse-shaper 24. The output of amplifier and pulse-shaper 24 is then analyzed in a multichannel pulse-height analyzer 25, the output of which is displayed on a display 26 in the form shown in the photographs of FIG. 6a through 6d illustrating the number of alpha particles counted versus the alpha-particle energy or collected charge. As the particles are counted the number of counts within each energy (collected charge) interval is recorded and displayed as shown in the photographs of FIGS. 6a, b, c, and d. The photograph in FIG. 6a shows the complete alpha-particle emission spectrum obtained from the Th-228 source as illustrated in FIG. 4. The two largest energy peaks are 6.78 MeV and 8.78 MeV. Both photographs of FIGS. 6a and b show virtually identical spectra. The average range of an 8.78 MeV alpha-particle in silicon is 59 $\mu$m. The depletion width $W_{SB}$ for photographs of FIGS. 6a and 6b are 61 $\mu$m and 44 $\mu$m, respectively, as obtained directly from differential capacitance measurements as a function of bias voltage from FIG. 3. In photograph A the depletion width (61 $\mu$m) is greater than the range (59 $\mu$m) of the most penetrating 8.78 MeV alpha-particle. Therefore, all of the ionization charge is collected, i.e.:

$$Q_C = (8.78 \text{ MeV}/22.5 \text{ MeV/pC}) = 0.390 \text{ pC}$$

In the photograph of FIG. 6b, the depletion width 44 $\mu$m is 15 $\mu$m less than the longest range (59 $\mu$m). Since no charge is lost from the last 15 $\mu$m of the ion track outside the original depletion region, the electric field must be extended by that distance. This in effect represents a funnel length of 59 $\mu$m–44 $\mu$m = 15 $\mu$m for 8.78 MeV alphas at this bias voltage (30 volts).

The table of FIG. 7 contains a complete set of data obtained for a gold N-type silicon SSBD. Observe that as the bias voltage and depletion width are further decreased as shown in the photograph of FIG. 6c, the 8.78 MeV peak decreases in energy at the peak by an amount $\delta E_{MAX} = 0.21$ MeV. Furthermore, the energy spread becomes pronounced, i.e., $\alpha E = 0.4$ MeV. The value of $\delta E_{MAX}$ represents the amount of charge lost at the end of the ion track owing to diffusion away from the Schottky barrier. The energy dispersion, $\Delta E$, reflects range-straggling at the end of the ion track, i.e., there is a variation in the distance traveled by individual ions due to straggling. The value of $\alpha E = 0.4$ MeV represents a range variation of $\Delta R = 2.0$ $\mu$m (see FIG. 4). The photograph of FIG. 6d illustrates the further diminuation of the charge collected from the 8.78 MeV alphas by a further reduction in the bias voltage to 11 volts. Photograph of FIG. 6d also shows that the 6.78 MeV alphas whose range equals 40 $\mu$m are experiencing charge loss due to the decreased depletion width of 27 $\mu$m, indicating a funnel length of approximately 13 $\mu$m.

The type of data obtained from SSBDs using the electronic system such as that illustrated in FIG. 5, and exemplified in FIGS. 6a through 6d and the table of FIG. 7, clearly indicates the role of field funneling and range straggling in the charge collected from ion tracks in silicon solid state devices. This technique has an advantage over that of observing individual particle response; i.e., output voltage as a function of time, since the individual tracks exhibit different charge losses by diffusion due to range straggling. A disadvantage of this technique is that it does not directly measure the charge-collection time. However, charge-collection time measurements for times less than 1 ns are plagued by experimental difficulties. The data clearly show the effect of electric-field-enhanced charge collection, or field funneling. It should be emphasized that, in principle, the electric field along an ion track extends to the end of the track. Since the field diminishes with distance from the surface, charge loss due to diffusion becomes more pronounced as the distance increases. Therefore, the concept of a funnel length is somewhat nebulous, since it varies with particle mass, energy, detector bias, doping level, etc.

Figure 6:
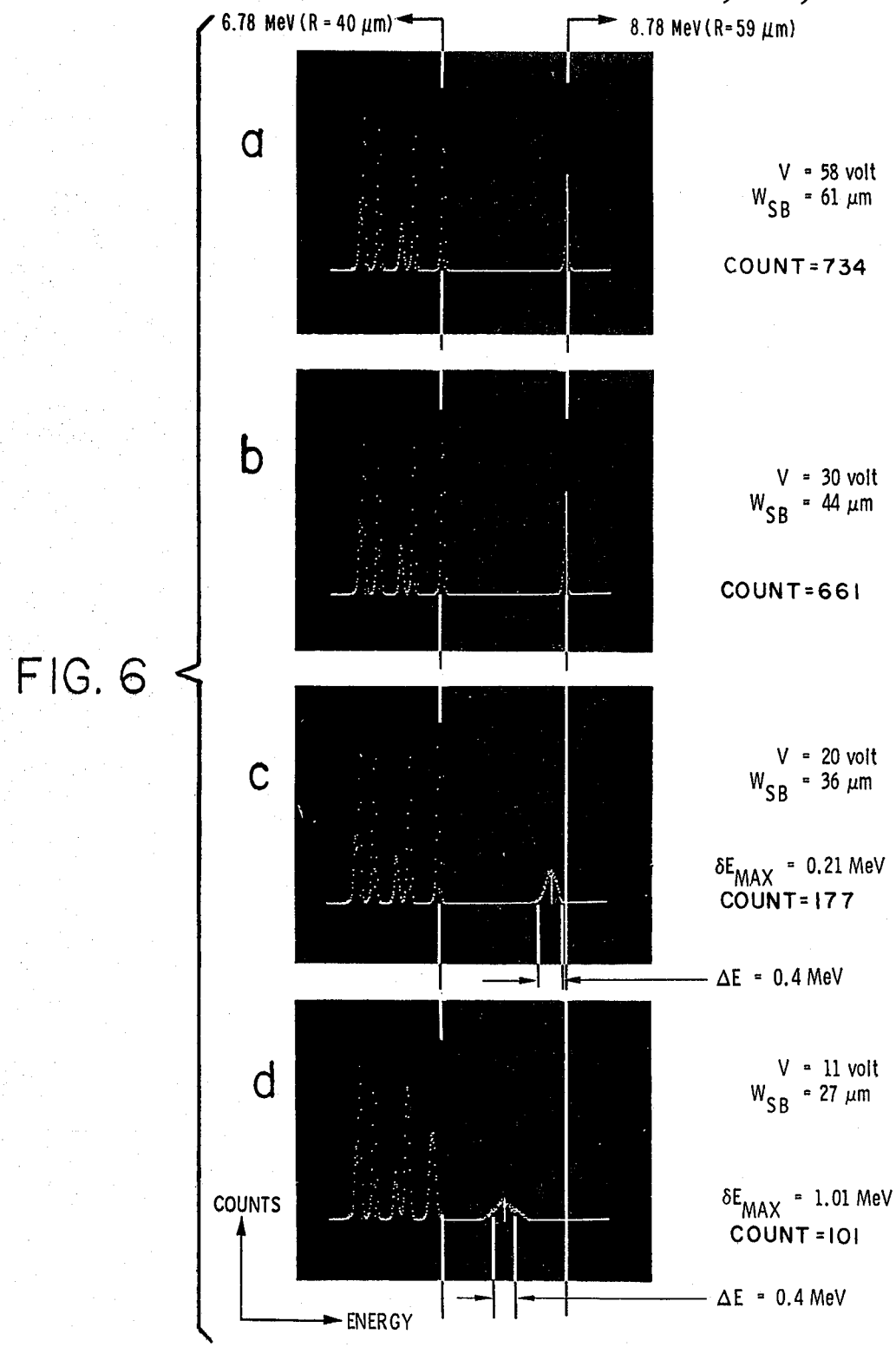
FIGS. 6a, b, c, and d are photographs of oscilloscope traces displaying charge collection data for Th-228 alpha-particles in a silicon-surface-barrier detector at four different bias-voltage levels.

The method described herein may be used to measure charge collection in semiconductor junction devices ($Q_C$ in the table of FIG. 7) with both Schottky barriers (SSBDs) and P-N junctions (discrete devices and ICs). These measurements can be obtained with the commercially available electronic system illustrated in FIG. 5. The maximum field funnel length can be determined by detecting the point at which a portion of the charge is no longer collected by drift, i.e., the point at which the collected charge starts to move to the left in the photographs of FIG. 6, such is illustrated in photograph 6b. The electric-field funneling length is then calculated by measuring the difference, at the second bias voltage level at which this happens, of the depletion width and the ion penetration range. Range straggling may be measured by further lowering the bias voltage to a level at which the particles are collected over a spread of energy while at least some of them are still collected at the selected energy as shown in FIG. 6c, where the charge collected for the 8.78 MeV alpha-particles ranges downward but up to the 8.78 MeV energy level. In the photograph of FIG. 6d the charge collected from the 8.78 MeV alphas is further dispersed and contains the effect due to diffusion and other effects which tend to make this data less useful.

The measurements of charge collected from ion tracks in semiconductor devices is of utility in the assessment of single event upset in IC chips. In conclusion, the technique of this invention may be used to measure both prompt and delayed charge collection from ion tracks in semiconductor devices by varying the device bias potential, the ion energy, and the ion species. The device or SSBD in which the charge collection was observed is constructed from low-doped N-type ($N_S = 2 \times 10^{13}$ cm) silicon and is operated at large reverse-bias potential up to 60 volts. For more highly doped silicon materials and lower bias voltages, the junction depletion width will be smaller. Therefore, for junction devices contained in integrated circuits, the differentiation between field-aided (drift) charge collection and that which occurs by diffusion will not be as clear as for the SSBD. Devices made from materials other than silicon (e.g., GaAs) will behave differently from either the SSBD or the silicon integrated circuits. Charge collection from ions heavier than alpha-particles will exhibit plasma-time and pulse-height effects not seen with the light He nuclei.

Since the principles of the invention have now been made clear, modifications which are particularly adapted for specific situations without departing from those principles will be apparent to those skilled in the art. Consequently, the appended claims are intended to cover such modifications as well as the subject matter described, and to be limited only to the true spirit of the invention.

What is claimed is:

1. A method of measuring electric-field funneling length comprising steps of irradiating a semiconductor charge collecting junction with electron-hole-pair generating charged particles at a first junction bias voltage level selected such that an ion penetration range is shorter than a depletion region so that all of a charge generated at a selected energy level is collected by drift and measures in a band of a multi-channel analyzer, and reducing said bias voltage to a second level in order to reduce the depth of the depletion region, such that a total charge generated can no longer be collected by drift and measured in said band, to obtain a point at which such charge is no longer collected which is representative of the electric field funneling length 2. The method of claim 1 wherein said second level is detected by detecting a bias voltage level at which energy collected at said selected energy level first begins to diminish.

3. The method of claim 2 wherein said semiconductor charge collecting junction is a silicon surface barrier detector.

4. The method of claim 1 wherein the same steps are performed at other selected energy levels detected at other bands of said multichannel analyzer in order to measure the electric-field funneling length at each of said other selected energy levels.

5. The method of claim 1 wherein the electric-field funneling length is calculated by measuring a difference at said second bias voltage level of a depletion width and said ion penetration range.

6. The method of claim 1 including a step of measuring range straggling by further lowering said bias voltage to a third level at which the particles are collected over a spread of energy levels while at least some particles are still collected a said energy level whereby different depths of penetration of the particles are determined while additional effects due to diffusion are minimized.

* * * * *